United States Patent
Houldsworth

(10) Patent No.: US 7,589,533 B2
(45) Date of Patent: Sep. 15, 2009

(54) ONE TIME OPERATING STATE DETECTING METHOD AND APPARATUS

(75) Inventor: John Houldsworth, Reston, VA (US)

(73) Assignee: Texas Instruments Northern Virginia Incorporated, Dallas, TX (US)

( * ) Notice: Subject to any disclaimer, the term of this patent is extended or adjusted under 35 U.S.C. 154(b) by 0 days.

(21) Appl. No.: 11/467,772

(22) Filed: Aug. 28, 2006

(65) Prior Publication Data

US 2007/0052422 A1 Mar. 8, 2007

Related U.S. Application Data

(63) Continuation-in-part of application No. 11/181,841, filed on Jul. 15, 2005, now Pat. No. 7,248,053.

(60) Provisional application No. 60/588,289, filed on Jul. 15, 2004.

(51) Int. Cl.
*G01N 27/416* (2006.01)

(52) U.S. Cl. .................... 324/426; 320/106

(58) Field of Classification Search .......... 324/421, 324/426, 427, 538; 320/107, 106
See application file for complete search history.

(56) References Cited

U.S. PATENT DOCUMENTS

| | | | |
|---|---|---|---|
| 3,711,770 A | 1/1973 | Wilson | |
| 4,207,514 A | 6/1980 | Klein | |
| 4,539,516 A * | 9/1985 | Thompson | 320/101 |
| 4,710,720 A * | 12/1987 | Weiner | 324/550 |
| 4,987,372 A | 1/1991 | Ofori-Tenkorang et al. | |
| 5,221,888 A | 6/1993 | Moody | |
| 5,349,282 A | 9/1994 | McClure | |
| 5,372,898 A | 12/1994 | Atwater et al. | |
| 5,444,378 A * | 8/1995 | Rogers | 324/428 |
| 5,659,240 A * | 8/1997 | King | 320/134 |
| 5,661,042 A * | 8/1997 | Fang et al. | 438/17 |
| 6,014,141 A | 1/2000 | Klein | |
| 6,097,193 A * | 8/2000 | Bramwell | 324/429 |
| 6,195,613 B1 * | 2/2001 | Roy et al. | 702/65 |
| 6,396,298 B1 | 5/2002 | Young et al. | |
| 6,549,014 B1 * | 4/2003 | Kutkut et al. | 324/426 |
| 6,967,483 B2 * | 11/2005 | Kwark | 324/421 |
| 2003/0201755 A1 * | 10/2003 | Briggs et al. | 320/135 |
| 2005/0118497 A1 * | 6/2005 | Breen | 429/93 |

\* cited by examiner

*Primary Examiner*—Vincent Q Nguyen
(74) *Attorney, Agent, or Firm*—William B. Kempler; Wade J. Brady, III; Frederick J. Telecky, Jr.

(57) ABSTRACT

A method and apparatus for detecting a change in an electrical property between contacts. A one-time operating state detection device includes a member coupling a pair of contacts and a detector for detecting a change in the coupling between the pair of contacts when the member is moved.

56 Claims, 6 Drawing Sheets

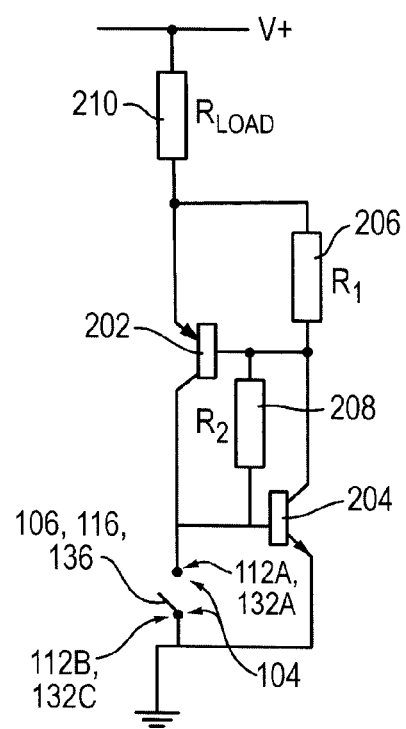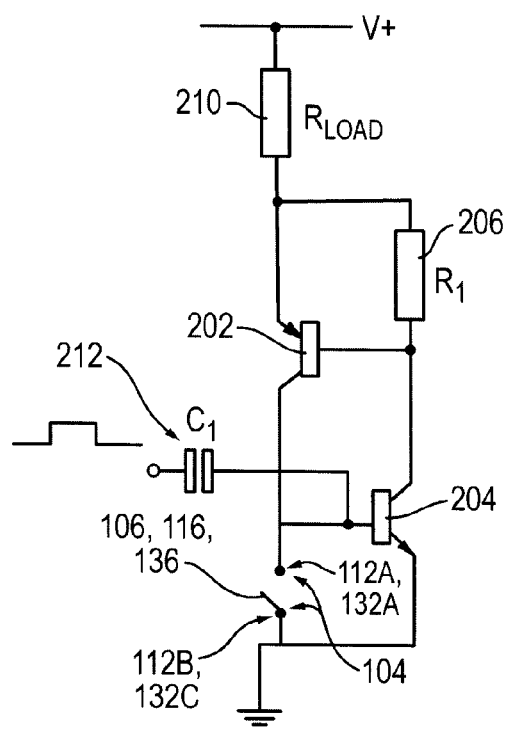
Fig. 2A
Fig. 2B

ONE TIME OPERATING STATE DETECTING METHOD AND APPARATUS

CROSS-REFERENCE TO RELATED APPLICATIONS

This application is a continuation-in-part of U.S. patent application Ser. No. 11/181,841 filed on Jul. 15, 2005 which claims priority from provisional Patent Application Ser. No. 60/588,289 filed on Jul. 15, 2004, the entire contents of both applications are incorporated herein by reference.

FIELD OF THE INVENTION

The invention relates generally to a one-time operating method and apparatus for detecting a change in state.

BRIEF DESCRIPTION OF THE DRAWINGS

A more complete appreciation of the various embodiments will be readily obtained by reference to the following detailed description when considered in conjunction with the accompanying drawings, wherein

FIG. 2A illustrates a circuit diagram of a state detection device, according to an embodiment of the present invention;

FIG. 2B illustrates a circuit diagram of a state detection device, according to an embodiment of the present invention;

DETAILED DESCRIPTION OF SEVERAL EMBODIMENTS

Embodiments of the invention include one-time operating apparatuses, systems and methods for detecting a change in state. The invention can be used to activate or deactivate any circuitry by changing from a first operating state to a second operating state in response to a change in an electrical property between contacts. For example, the invention can activate or deactivate a battery management function. For example, such battery management function can be to completely discharge a battery pack prior to disposal. Alternatively, the invention can be used to activate or deactivate a state-of-charge indicator. Other applications include, for example, implementing a security seal on the enabling of a function or device to indicate whether a device was ever put into service; enabling a battery operated device after a potentially long shelf life; activation of an emergency beacon; automatic activation on physically opening a device; or an acceleration/deceleration sensor in which a mass is attached to the member to detect crash, impact or bump. Of course, the invention has numerous other applications as would be known to those skilled in the art. It should be understood that the apparatuses and methods described herein may be implemented by any combination of hardware, software and/or firmware.

Various embodiments for implementing a battery pack discharge function will be described in more detail below. As used herein, the term "battery pack" may represent any power source that may be employed to power a load. For example, a battery pack may be utilized to power such devices as, without limitation, a processor; a microprocessor; a personal computer, such as a laptop, palm PC, desktop or workstation; an electronic wired or wireless device, such as, for example, a telephone or electronic transceiver box; a cellular telephone; a personal digital assistant; an electronic pager and digital watch. In various embodiments, the battery pack may comprise, but is not limited to, a lithium, lithium-ion, $LiSO_2$, nickel-metal hydride (NiMH) and/or nickel-cadmium (NiCad) battery pack.

Figure 1A:
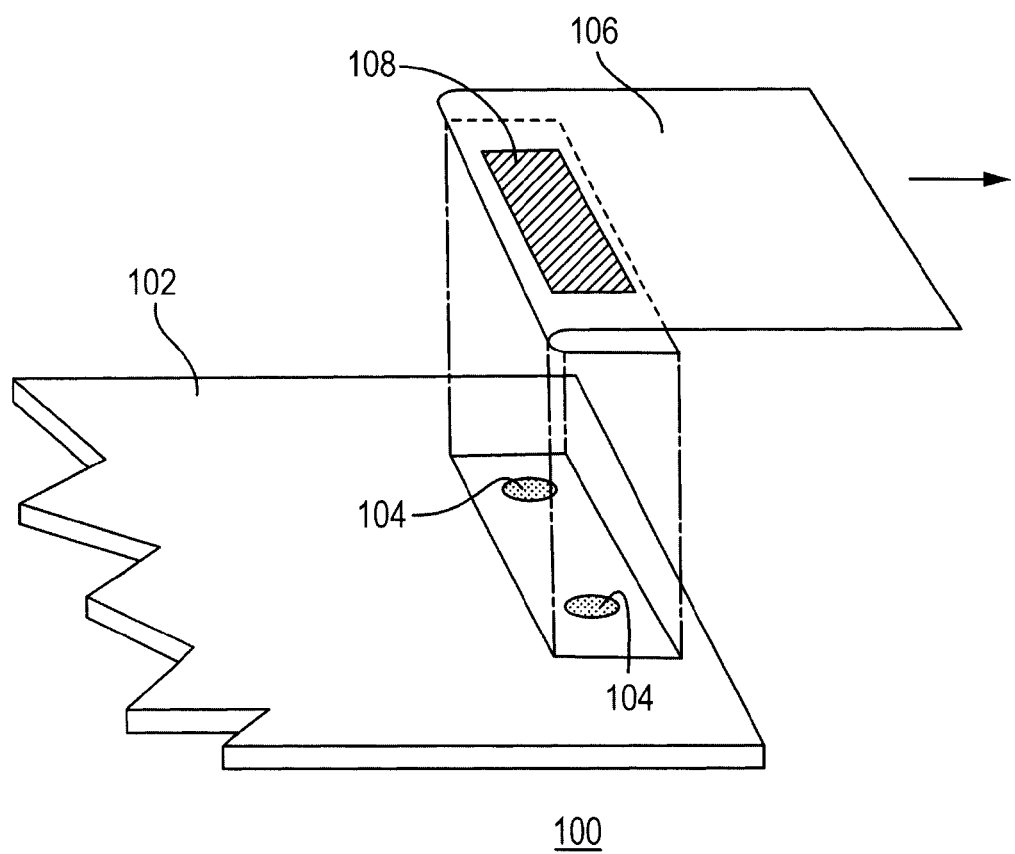
FIG. 1A illustrates a member for changing an electrical property between contacts according to an embodiment of the present invention.

FIG. 1A illustrates a one-time operating member for changing an electrical property between contacts in a detection device, according to an embodiment of the present invention. The detection device 100 includes a printed circuit 102 having a pair of electrical contacts 104. In various embodiments, the printed circuit 102 can be integrated into a battery casing or can be housed separately from the battery casing. The printed circuit 102 can be a formed from a hard substrate material, such as a printed circuit board or from a fairly flexible substrate material. The electrical contacts 104 can be located on a front side of the printed circuit 102 with various mounted components. Alternatively, the contacts 104 may be located on a back side of the printed circuit 102 without mounted components so that additional printed circuit area is not required for the implementation of the detection device.

A one-time removable member 106 comprising a conductive layer 108 is initially coupled to the contacts 104 to form a conductive coupling. For various applications, the member 106 is one-time removable to ensure activation (and to prevent deactivation) of a desired function, such as the complete discharge of a battery pack prior to disposal.

In one embodiment, the one-time removable member 106 may comprise a flexible tape or ribbon. For example, the member 106 may be formed from any material of suitable integrity, such as mylar, kapton or the like, such that the member 106 may completely separate from the contacts 104 when desired. The conductive layer 108 may comprise any material suitable for electrical conduction, such as, for example, gold, copper, platinum or the like and may cover a portion of the surface area of the member 106, as shown. Alternatively, the conductive layer 108 may cover the entire surface area of the member 106.

The one-time removable member 106 may be coupled to the printed circuit 102 so that the conductive layer 108 may conductively couple the contacts 104 by any variety of methods. For example, the conductive layer 108 of the member 106 may be coupled to the contacts 104 via reflow soldering, using a conductive adhesive, or by any other suitable technique that is compatible with printed circuit surface mount assembly techniques. The remainder of the one-time removable member 106 that is not in contact with the contacts 104 and/or the printed circuit 102 is configured to fold back over the portion of the member 104 that includes the conductive layer 108. Removing the folded portion of the member 106 in the indicated direction causes the portion of the member 106 that includes the conductive layer 108 to decouple from the printed circuit 102, terminating the conductive coupling between the conductive layer 108 and the contacts 104.

In one embodiment, the printed circuit 102 additionally comprises a detector such as, for example, an electronic circuit for detecting the conductive coupling between the member 106 and the contacts 104. When the detector detects a change in the coupling between the contacts 104, the detector may, for example, selectively operate a battery management function. In various embodiments, the battery management function may comprise, for example, a battery discharge operation or a state-of-charge indication. Alternatively, the battery management function may comprise a plurality of such functions.

Figure 1B:
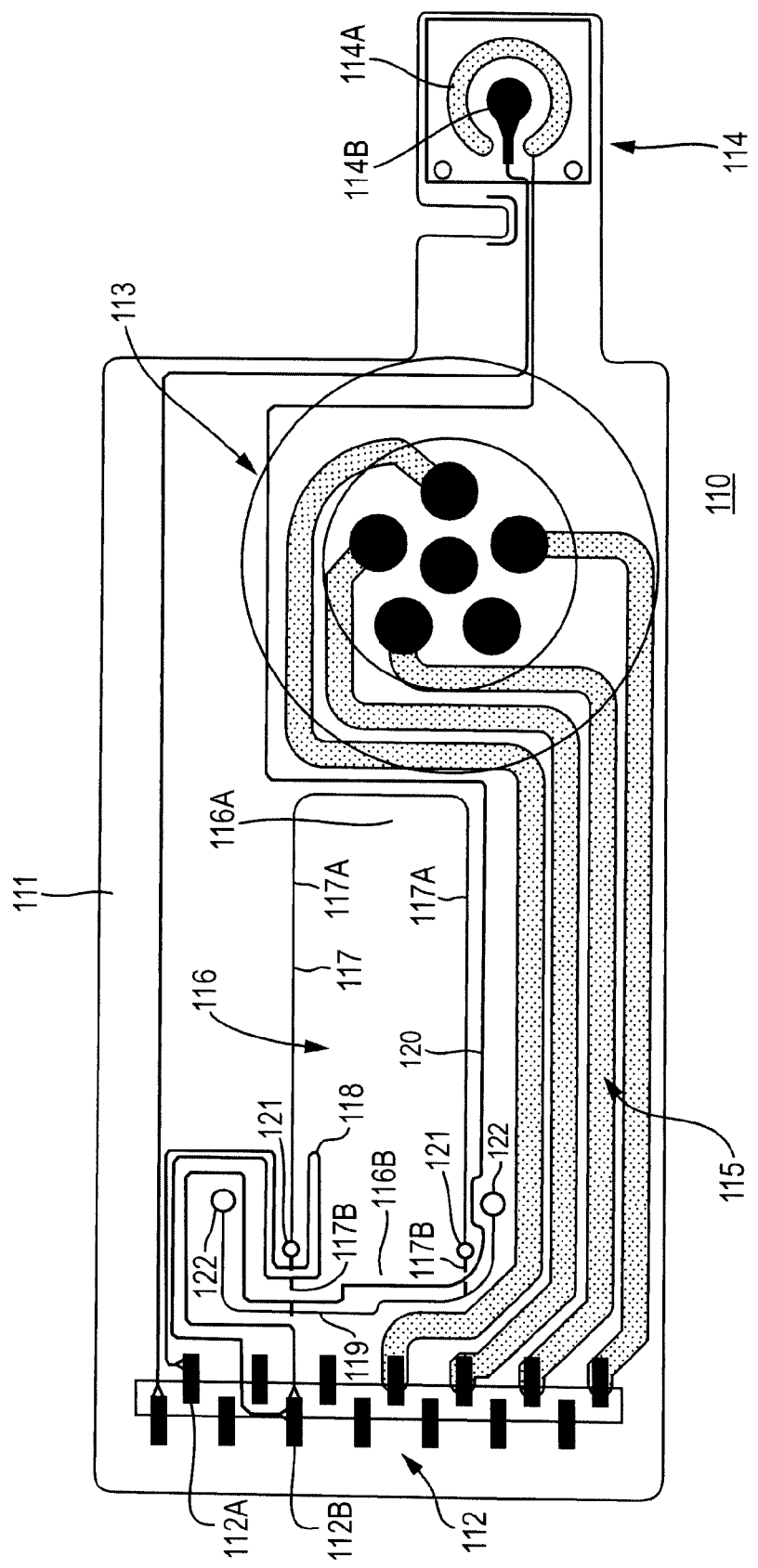
FIG. 1B illustrates a member for changing an electrical property between contacts, according to another embodiment of the present invention.

FIG. 1B illustrates a one-time operating member for changing an electrical property between contacts in a detection device, according to another embodiment of the present invention. The detection device 110 includes a printed circuit 111 having a plurality of contacts 112. For example, the printed circuit 111 can be integrated into a battery casing or can be housed separately from the battery casing. The printed circuit 111 may be provided with one or more electrical connectors 113 for connecting electrical components such as a batteries, voltage and/or current detectors and the like. In one embodiment, the electrical connector 113 is a six pin connector for connecting the device 110 to a battery pack (not shown). The printed circuit 111 may also be provided with one or more switches 114. In one embodiment, the switch 114 is a push button switch as depicted in FIG. 1B. A connector dome not depicted herein may be used to connect the semi-circular contact 114A in the switch 114 to the central contact 114B in the switch 114 to provide ON/OFF switching.

The printed circuit 111 is made from a flexible material such as a polymeric material. For example, the printed circuit 111 can be made from a polyimide such as Kapton® or the like. Electrical lines 115 are provided in the printed circuit 111 for electrically connecting different points in the circuit. For example, the electrical lines 115 can be used to electrically couple pins of the six pin connector 113 with contacts 112. The electrical lines 115 can be made from a conductive material such as copper, aluminum, or the like.

A tab 116 is provided in the printed circuit 111. The tab 116 is an integral part of the printed circuit. Hence, the tab 116 can be made from the same material as the printed circuit 111. The tab 116 is partially cut out from the printed circuit 111. The tab 116 is cut along the line 117. The tab 116 is shown having a rectangular shape. However, it must be appreciated that the tab 116 may have any other suitable shape. The tab 116 is cut out from the printed circuit 111 along a portion 117A of the circumference of the tab 116 to form an unattached extremity 116A. Holes 121 are provided at the end of the cut portion 117A to terminate the cut. The tab 116 is attached to the printed circuit 111 along portion 117B of the circumference of the tab 116 to form an attached extremity 116B. A line 119 is also cut in the printed circuit 111 opposite the attached portion 116B of the tab 116. Holes 122 are also provided at the end of the cut line 119 to terminate the cut.

One or more electrical or conductive lines 118 for connecting various points or contacts in the circuit are routed through the tab 116. Specifically, contact 112A and contact 112B in the plurality of contacts 112 are electrically connected through electrical line 118 which meanders in the printed circuit 111 to extend through the portion 117B of the tab 116 and into the tab 116. In addition, electrical line 120 electrically couples the contact 112B and the contact 114A of switch 114. The electrical line 120 is also routed through the portion 117B of the tab 116. In the embodiment depicted in FIG. 1B, the conductive line 118 directly connects the contacts 112A and 112B. However, it can be contemplated that one or more electronic components can be connected to conductive lines passing through the tab 116, such as the conductive line 118. For example, a capacitor, a resistor, an inductor, a diode, a transistor or the like, or a combination of these components can be connected to the conductive line 118 between the contacts 112A and 112B inside the tab 116.

The tab 116 plays the role of a one-time switch. When the tab 116 is pulled by grabbing the unattached extremity 116A of the tab 116, the portion 117B of the tab 116 that was attached to the printed circuit 111 is torn along the dotted lines as indicated in FIG. 1B. The cut line 117A of tab 116 joins the cut line 119 through the dotted lines and the tab 116 is then detached from the rest of the printed circuit 111. In the process of pulling the tab 116 to tear the portion 117B of the tab 116 attached to the printed circuit 111, the electrical lines 118 and 120 which pass through the portion 117B are also cut. As a result, the electrical line 118 connecting contact 112A and contact 112B is severed and the electrical line connecting the contact 112B and the contact 114A of switch 114 is also severed. Thus, the conductive coupling between the contact 112A and contact 112B is terminated once the electrical line 118 is severed. The electrical line 118 forms a U-shaped path around the cut portion 117A of the circumference of the tab 116. The U-shaped path of the electrical line 118 around the portion 117A ensures that the electrical line 118 is cut when the tab 116 is pulled by guiding the cutting through the electrical line 118. However, instead of a U-shaped path, other shapes can also be selected for ensuring the severance of the electrical line 118.

Similarly, in the case where one or more electrical component (e.g., capacitors, inductors, resistors, etc.) are provided inside or integrated in the tab 116 or are connected to terminals in the conductive line 118 provided inside the tab 116, pulling the tab 116 will result in the conductive line 118 connecting to the components to the contacts 112A and 112B being severed. As a result, the one or more components which are associated with the tab 116 are disconnected and hence the electrical coupling between the contacts 112A and 112B is changed. The electrical coupling between the contacts 112A and 112B can be selected to be a capacitive coupling, an inductive coupling, a conductive coupling, a semi-conductive coupling or the like by selecting the components that are associated with the tab 116.

In one embodiment, the printed circuit 111 additionally comprises a detector such as, for example, an electronic circuit for detecting the conductive coupling between the contacts 112A and 112B. Similar to the embodiment depicted in FIG. 1A, when the detector detects a change in the state of coupling between the contacts 112A and 112B (for example, following the severance of the electrical line 118), the detector may, for example selectively operate a battery management function. The battery management function may comprise, for example, a battery discharge operation or a state-of-charge indication. Alternatively, the battery management function may comprise a plurality of such functions.

Hence, the tab 116 plays a similar role as the one-time removable member 106 depicted in FIG. 1A. However, instead of being applied as a tape to the printed circuits as in the case for the one-time removable member 106, the tab 116 is part of the printed circuit and thus is simply cut from the rest of the printed circuit when activation, deactivation and/or any other function is desired. For example, the tab 116 can be used to ensure activation (and to prevent deactivation) of a desired function, such as the complete discharge of a battery pack prior to disposal.

Figure 1C:
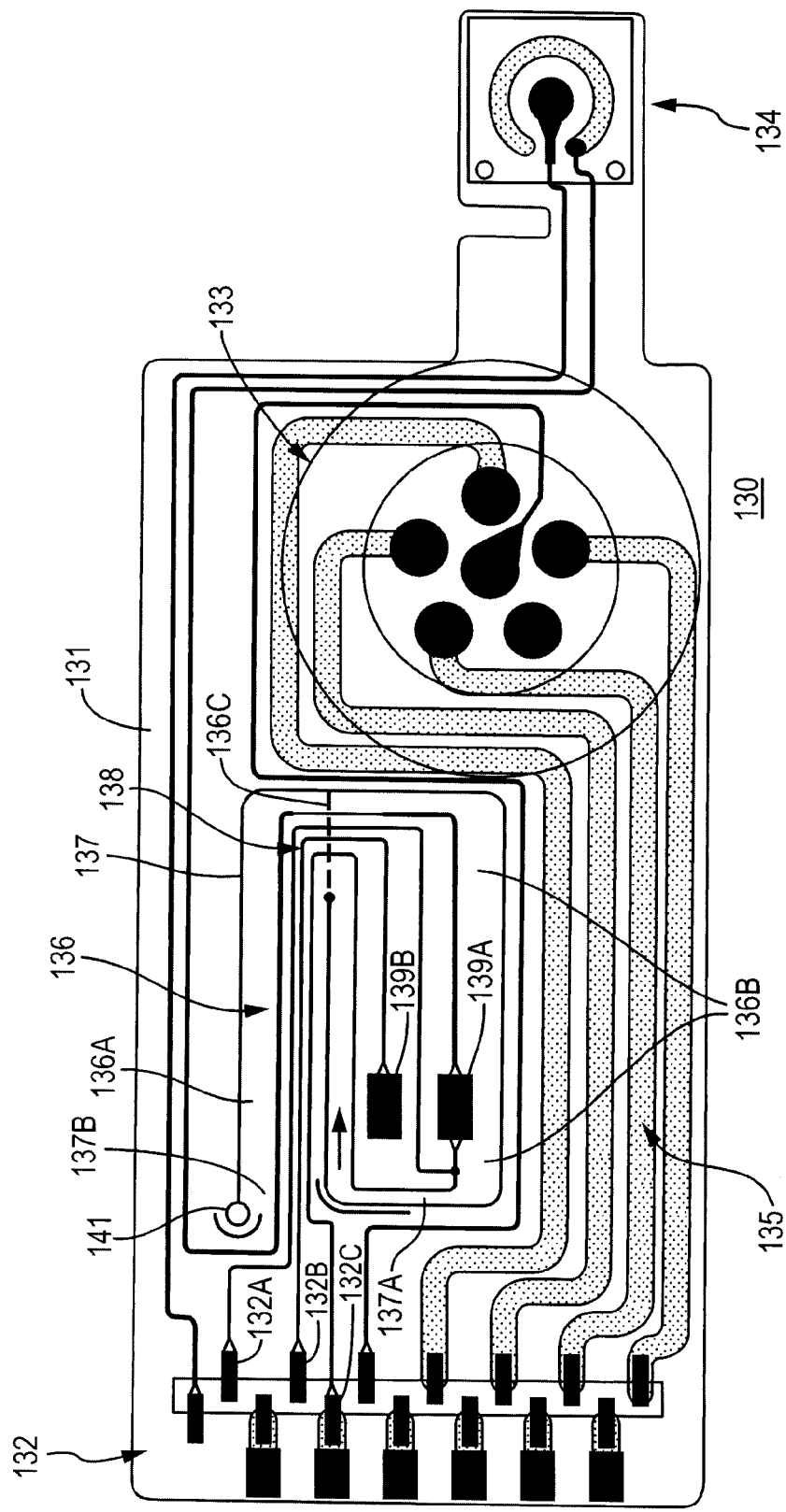
FIG. 1C illustrates a member for changing an electrical property between contacts, according to yet another embodiment of the present invention.

FIG. 1C illustrates a one-time operating member for changing an electrical property between contacts in a detection device, according to yet another embodiment of the present invention. The embodiment is similar in many aspects to the embodiment depicted in FIG. 1B. Therefore, detailed description of similar component would not be repeated in the following paragraphs. Similar to the detection device 110, the detection device 130 depicted in FIG. 1C includes a printed circuit 131 having a plurality of contacts 132. The printed circuit 131 may be provided with one or more switches 134. For example, connector 133 and switch 134 can be similar to connectors 113 and switch 114 described in the previous embodiment.

Similar to the printed circuit 111, the printed circuit 131 is made from a flexible material such as a polymeric material (for example, a polyimide or the like). Electrical lines 135 are provided in the printed circuit 131 for electrically connecting different points in the circuit. For example, the electrical lines 135 can be used to electrically couple connections in connector 133 with contacts 132. The electrical lines 135 can be made from a conductive material such as copper, aluminum, or the like.

A flap 136 is provided in the printed circuit. Similar to the tab 116 in printed circuit 111, the flap 136 is an integral part of the printed circuit 131. The flap 136 is partially cut out from the printed circuit 131. In the present embodiment, the flap 136 is cut along the line 137 forming an inverted G-line. The flap 136 is detached from the printed circuit 131 along the line 137 to form a detached extremity 137A of the flap 136 and an attached extremity 137B of the flap 136. A hole 141 is provided at the end of the line 137 to terminate the cut. The flat 137 can be seen as a two flap portions 136A and 136B connected along an imaginary line 136C indicated by a dotted line in FIG. 1C.

One or more electrical or conductive lines 138 for connecting various points or contacts in the circuit are routed through the flap 136. Specifically, contact 132A, contact 132B and contact 132C in the plurality of contacts 132 are electrically connected to terminal connectors 139A and 139B through electrical lines 138. In addition, contacts 132A and 132C are directly connected through electrical lines 138 via common connection point 139A. Electrical lines 138 meander in the printed circuit 131 to extend through the flap portion 136A to reach the flap portion 136B by crossing the line 136C. The terminal connectors 139A and 139B may be provided inside the flap portion 136B for connecting electronic components such as resistors, capacitors, inductors, diodes, transistors and the like or more complex components such as voltage detectors, electrical sensors or the like.

Similar to the embodiments depicted in FIGS. 1A and 1B, the flap 136 plays the role of a one-time switch. When the flap 136 is pulled by grabbing the unattached extremity 137A of the flap 136 towards an opposite extremity in the direction of the arrow (as shown in FIG. 1C), the flap portion 136B is torn from the flap portion 136A along the dotted line 136C. The cut line 117 in flap portion 136B intersects itself though the dotted line 136C. As a result, the flap portion 136C is detached from the rest of the printed circuit 131.

In the process of pulling the flap 136B to tear the flap portion 136B attached to the flap portion 136A, the electrical lines 118 which pass through the dotted line 136C are also cut. As a result, the electrical lines 118 connecting contacts 132A-C and terminals 139A-B are severed. Hence, the one or more electrical component (e.g. capacitors, inductors, resistors, diodes, sensor devices, etc.) connected to terminals 139A and 139B are disconnected which results in changing the electrical coupling between the connectors 132A, 132B and/or 132C. In addition, the severance of the electrical lines 118 also eliminates the direct electrical coupling between the contacts 132A and 132C.

Similar to the embodiments depicted in FIGS. 1A and 1B, the printed circuit 131 may additionally comprise a detector such as, for example, an electronic circuit for detecting the conductive coupling between the two or more of contacts 132A, 132B and 132C. When the detector detects a change in the state of coupling between two or more of contacts 132A, 132B and 132C (for example, following the severance of the electrical lines 118), the detector may, for example, selectively operate a battery management function. The battery management function may comprise, for example, a battery discharge operation or a state-of-charge indication. Alternatively, the battery management function may comprise a plurality of such functions.

Therefore, the flap 136 plays a similar role as the tab 116 depicted in FIG. 1B or the one-time removable member 106 depicted in FIG. 1A. However, instead of being applied as a tape to the printed circuit as in the case of the one-time removable member 106, the flap 136, in the same fashion as tearable tab 116, is part of the printed circuit and thus is simply cut from the rest of printed circuit when activation, deactivation and/or any other function is desired.

FIG. 2A illustrates a detection device according to various embodiments. In one embodiment, the detection device comprises a discrete transistor latch circuit 200 that includes upper and lower bi-polar transistors, 202 and 204 respectively, resistors R1 and R2, 206 and 208 respectively, the one-time removable member 106 of FIG. 1A, the tab 116 depicted in FIG. 1B or the flap 136 depicted in FIG. 1C, represented as a switch and a load resistor 210 connected to a battery pack. In one embodiment, the latch circuit 200 may be armed for discharging the battery pack by removing the one-time removable member 106 to break the conductive coupling between the member 106 and the electrical contacts 104. In another embodiment, the latch circuit 200 may also be armed for discharging the battery pack by tearing the one-time removable tab 116 to break the conductive line coupling the contacts 112A and 112B or by tearing the one-time removable flap 136 to break the conductive line coupling the contacts 132A and 132C.

In operation, the transistors 202 and 204 are arranged to provide a feedback loop. The base and the emitter of the lower transistor 204 and conductively coupled via the one-time removable member 106, via the conductive line 118 passing through the tab 116, or via the conductive lines 138 passing through the flap 136, to ensure that the "latch" is maintained in a first "reset" state. As such, the base to emitter voltage, or $V_{BE}$, or the lower transistor 204 is about 0 in the first mode, maintaining transistor 204 in a nonconductive state. The values of resistors R1 206 and R2 208 are selected to maintain transistor 202 nonconductive. When the member 106 is removed from being electrically coupled with the contacts 104 or when the conductive line 118 which electrically couples contacts 112A and 112B and passing through the tab 116 is severed or when the conductive lines 138 which electrically couple contacts 132A and 132C and passing through the flap 136 are severed, the latch circuit 200 is armed such that it may be triggered to change from the first reset state to a second "latched" or active state by a relatively small current into the base of transistor 204. For example, a triggering current may be provided via resistor R2 208. This causes transistor 204 to conduct, which, in turn, causes transistor 202 to conduct. In the second latched or active state, the main current through the load resistor 210 will flow through transistors 202 and 204 to begin the discharge operation.

FIG. 2B illustrates another embodiment of a detection device comprising a discrete transistor latch circuit 200. In this embodiment, the latch circuit 200 employs a capacitively coupled pulse trigger 212 instead of resistor R2 208 to cause transistor 204 to become conductive once member 106 is removed, once the tab 116 is torn off or once the flap 136 is torn off. When the member 106 is removed from being electrically coupled with the contacts 104, or when the conductive line which electrically couples contacts 112A and 112B and passing through the tab 116 is severed, or when the conductive lines which electrically couple contacts 132A and 132C and passing through the flap 136 is severed, the armed latch circuit 200 may be triggered from the first reset state into the second active or 'latched' state by an electrical pulse from the pulse trigger 212, wherein a low duty-cycle pulse is used to trigger the lower transistor 204. It should be noted that in this embodiment, there is no trickle current in the reset state due to the removal of resistor R2 208, thus reducing battery drain in the reset state. The trigger pulse may be provided by a low duty-cycle pulse from the battery state-of-charge indicator circuit of co-pending U.S. patent application Ser. No. 11/151,222, filed Jun. 14, 2005, which is incorporated in its entirely herein by reference. Such pulse may be used to ensure that the lower transistor 204 is activated after the base and the emitter are decoupled. Once triggered, the 'latched' or active second state of the circuit 200 may be used, for example, to completely discharge the battery pack.

Figure 2C:
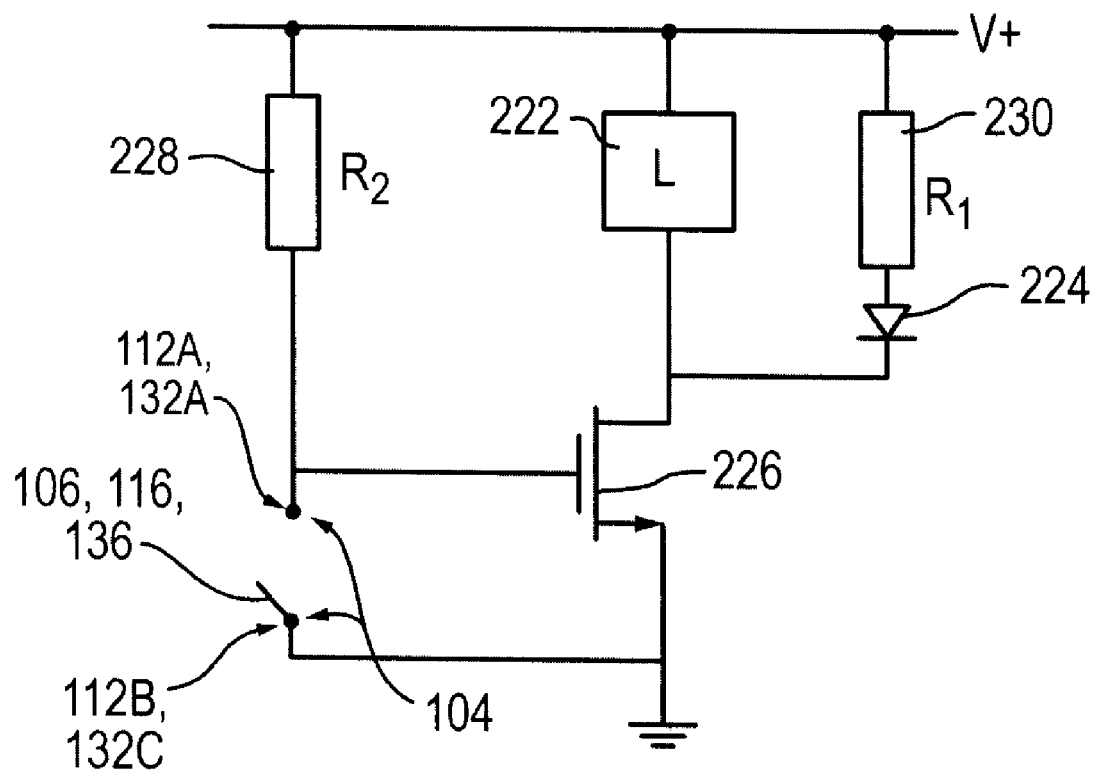
FIG. 2C illustrates a circuit diagram of a state detection device, according to an embodiment of the present invention.
Figure 3:
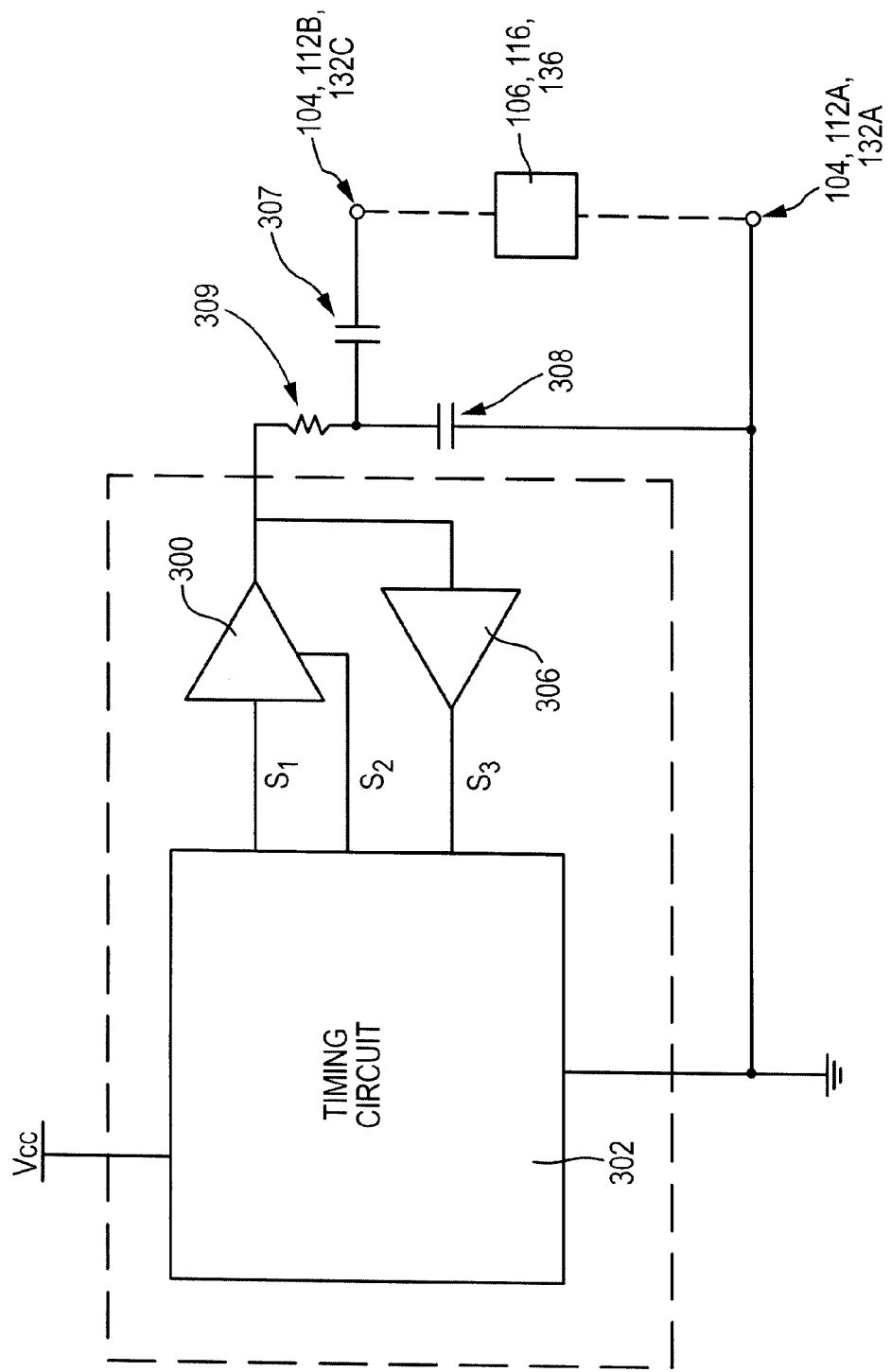
FIG. 3 illustrates a circuit diagram of a state detection device, according to an embodiment of the present invention.

FIG. 3 illustrates such a state-of-charge indicator. As explained in more detail below, a pulse is periodically applied to tri-state CMOS logic gate 300 on line $S_1$ and then another pulse is applied on line $S_2$. Either of these pulses may be used as trigger pulse 212 in FIG. 2B.

FIG. 2C illustrates an alternative embodiment of a detection device. In this embodiment, the circuit 220 may be employed for discharging a battery through a load 222. Similar to the first reset state of the circuits in FIGS. 2A & 2B, when the member 106 is coupled with the contacts 104 or when the conductive line passing through the tab 116 couples the contacts 112A and 112B or when the conductive line passing through the flap 136, the transistor 226 is not conductive. When the member 106 is removed from the contacts 104 or when the conductive line connecting the contacts 112A and 112B and passing through the tab 116 is severed, or when the conductive line connecting the contacts 132A and 132C and passing through the flap 136 is severed, the resistor R2 228 causes transistor 226 to conduct, such that the battery discharges through the load 222, as in the second active sate of the circuits in FIGS. 2A & 2B. Diode 224, which may be, for example, a light emitting diode (LED), will become active when transistor 226 conducts to indicate when the battery is discharging. Resistor R1 230 limits the input current through LED 224.

The detection of the conductance between the contacts 104, between contacts 112A and 112B are between contacts 132A and 132C may also be implemented with the circuit of FIG. 3. A pulse or step, on line $S_1$, is applied to tri-state CMOS logic gate 300, as controlled by timing circuit 302, which pulse is applied to the RC network including resistor 309, capacitor 308 and capacitor 307 (when member 106 is electrically connected to contacts 104, when the conductive line in tab 116 which connects contacts 112A and 112B is not severed, or when the conductive line in flap 136 which connects contacts 132A and 132C is not severed). The pulse on line $S_1$ has a width such that at the end of the pulse, the voltage across the RC network when contacts 104, contacts 112A and 112B or contacts 132A and 132C are open can be distinguished from the voltage when contacts 104 are connected by member 106 or when contacts 112A and 112B are connected via the tab 116 or when contacts 132A and 132C are connected via the flap 136. After the pulse on line $S_1$ terminates, a pulse is applied on line $S_2$ to cause the output of logic gate 300 to be open. The voltage across the RC network, which depends on the time constant of the RC network, which, in turn depends on whether contacts 104, contacts 112A and 112B, contacts 132A and 132C are connected or shorted, is read through digitizing gate 306. When the output of logic gate 300 is open, the voltage across the capacitor 308 appears on the input of the gate 306 since no current is flowing through resistor 309 and is read through digitizing gate 306. Gate 306 produces one logic level when its input is below a threshold and a second logic level when its input is over a threshold, indicating the state of connection between contacts 104 or between contacts 112A and 112B or between contacts 132A and 132C.

In various embodiments, a one-time operating state detection device is provided for selectively operating a battery management function based on a change in the capacitive coupling between electrical contacts. The detection device may comprise, for example, a one-time removable member that is capacitively coupled to the contacts. A detector may then detect a change in the capacitance between the contacts in response to the decoupling of the member for the contacts. In response to a detection of a change in the capacitance, which may be, for example, indicated by a change in the RC time constant associated with circuitry connected between the contacts, the detector may selectively operate a battery management function. As described above, the battery management function may be, for example, a battery discharge operation or a state-of-charge indication. Alternatively, the battery management function may comprise a plurality of such functions.

Referring again to FIG. 1A, a one-time operating member for forming a capacitive bridge between electrical contacts may be included in a detection device 100 comprising a printed circuit 102 including electrical contacts 104. The printed circuit 102 may be integrated into a battery casing. Alternatively, the printed circuit 102 may be housed separately from the battery casing. As in the conductive coupling embodiments, the electrical contacts 104 may be located on a front side of the printed circuit 102 with mounted components, or alternatively may be located on a back side of the printed circuit 102 without mounted components so that additional printed circuit area is not required.

In one embodiment, the member 106 may comprise a removable tape comprising a capacitive layer 108, wherein the capacitive layer 108 forms a portion of the member surface area. The removable member 106 may comprise a flexible tape or ribbon, which may be formed from a suitable material such as mylar, kapton or the like and the member 106 may be coupled to the printed circuit 102 so that the capacitive layer 108 forms a capacitive bridge between the electrical contacts 104. Alternatively, the capacitive layer 108 may comprise the entire surface area of the member 106. For example, the capacitive layer 108 of the member 106 may comprise a metallic strip insulated from conductive contact with the electrical contacts 104. The removable member 106 and capacitive layer 108 may be coupled to the electrical contacts 104 using a dielectric, such as an insulative adhesive, or any other surface mount assembly technique that is suitable to form the capacitive bridge between the contacts 104.

The remainder of the removable member 106 is configured to fold back over the portion of the member 106 that contains the capacitive layer 108, as illustrated in FIG. 1A. Removing the folded portion of the member 106 in the indicated direction causes the portion of the member 106 that contains the capacitive layer 108 to decouple from the printed circuit 102, removing the capacitive bridge between the electrical contacts 104.

In one embodiment, the printed circuit 102 comprises a detector which may, for example, be an electronic circuit for detecting a capacitive coupling between the electrical contacts 104 and for selectively operating a battery management function based on a detected change in the capacitive coupling from a first operating state to a second operating state. One such example is the impedance detection of co-pending U.S. patent application Ser. No. 11/151,222 as shown in FIG. 3.

Referring back to the circuit illustrated in FIG. 3, the time constant of the RC network when the member 106 capacitively couples contacts 104 is different from the time constant when member 106 is removed from contacts 106. For example, a shorter and faster RC time constant may indicate that the member 106 has been decoupled from the contacts 104. The width of the pulse on line $S_1$ can be selected so that gate 306 will produce one logic level when its input is below a threshold and a second logic level when its input is over a threshold, wherein each of the two logic levels from gate 306 indicate one of the operating states of the state detecting device (i.e., normal or discharge). In one embodiment, the detector may be adapted to selectively operate a battery management function circuit, such as a complete discharge device or a state-of-charge indicator as in co-pending U.S. patent application Ser. No. 11/151,222 based on the logic level of gate 306. Discrete or integrated logic circuits may be used to selectively operate, directly or indirectly, additional battery management functions such as monitoring battery state-of-charge or switching between operating modes based at least in part on the logic level of gate 306. For example, the detection may be used to control the conductivity of transistor 204 in FIG. 2A or 2B or transistor 226 in FIG. 2C without the direct connection of these transistors to contacts 104.

Therefore, the embodiments described herein provide for detecting a change in an electrical property between contacts. Particularly, the embodiments provide for a detection device which includes a one-time removable member for electrically coupling contacts and a detector for detecting a change in the coupling between the contacts when the member is removed.

Although the invention has been described in terms of various embodiments, it is not limited thereto. Rather, the appended claims should be construed broadly to include other variants and embodiments of the invention which may be made by those skilled in the art without departing from the scope and range of equivalent of the invention.

What is claimed is:

1. A one-time operating state detection device comprising:
   a pair of contacts;
   a member electrically coupling the pair of contacts, to each other in an original state, a portion of the member adapted to be only once movable to at least partially sever the portion from a remainder of the member to change the electrical coupling between the contacts, wherein the member is physically configured to prevent return to the original state; and
   a detector, wherein the detector is configured to detect the change in the coupling between the pair of contacts when the member is moved,
   wherein the electrical coupling between the pair of contacts is terminated once the member is moved to change the electrical coupling.

2. The detection device of claim 1, wherein the member conductively couples the pair of contacts.

3. The detection device of claim 2, wherein the member includes a conductive member removably connected to the contacts.

4. The detection device of claim 1, wherein the member capacitively couples the pair of contacts.

5. The detection device of claim 4, wherein the member includes a conductive member removably spaced from at least one of the contacts by a dielectric.

6. The detection device of claim 1, wherein the detector selectively operates a battery management function.

7. The detection device of claim 6, wherein the battery management function comprises a battery discharge operation.

8. The detection device of claim 6, wherein the battery management function comprises a state of charge indication.

9. The detection device of claim 1, wherein the detector comprises a latch circuit, the latch circuit being maintained in a first state prior to moving the member, and the change in the coupling enabling the latch circuit to change to a second state.

10. The detection device of claim 9, wherein the change to a second state is triggered by a current.

11. The detection device of claim 9, wherein the change to a second state is triggered by an electrical current pulse.

12. The detection device of claim 9, wherein the change to a second state is triggered by a battery management circuit.

13. The detection device of claim 12, wherein the battery management circuit comprises a battery state-of-charge indicator.

14. The detection device of claim 1, wherein the detector measures a change in an RC time constant associated with the coupling.

15. The detection device of claim 14, wherein the measuring comprises using an electrical current pulse.

16. The detection device of claim 14, wherein the measuring is triggered by a battery management circuit.

17. The detection device of claim 16, wherein the battery management circuit comprises a battery state of charge indicator.

18. The detection device of claim 1, wherein the member includes a removable tape.

19. The detection device of claim 18, wherein the tape is adapted to be only once removable from the contacts.

20. The detection device of claim 1, wherein the member comprises a conductive line for electrically coupling the pair of contacts, the member adapted to be moved by pulling the member so as to sever the conductive line.

21. A one-time operating state detection device comprising:
   a pair of contacts;
   a one-time operating member electrically coupling the pair of contacts in an original state, the member comprising a conductive line for electrically coupling the pair of contacts to each other, a portion of the member adapted to be pulled so as to at least partially sever the portion from a remainder of the member to sever conductive line, wherein the member is physically configured to prevent return to the original state; and
   a detector, wherein the detector is configured to detect the change in the coupling between the pair of contacts when the conductive line is severed.

22. The detection device of claim 21, wherein the member further comprises an electronic component connected to the conductive line.

23. The detection device of claim 21, further comprising a printed circuit, wherein the pair of contacts are connected to the printed circuit.

24. The detection device of claim 23, wherein the printed circuit comprises one or more electrical connectors for connecting one or more electrical components.

25. The detection device of claim 23, wherein the printed circuit is constructed from a flexible material.

26. The detection device of claim 25, wherein the flexible material comprises a polymeric material.

27. The detection device of claim 26, wherein the polymeric material is a polyimide.

28. The detection device of claim 23, wherein the printed circuit comprises a tab portion partially cut out from the printed circuit.

29. The detection device of claim 28, wherein the tab portion includes the member.

30. The detection device of claim 28, wherein the tab portion is cut out in a rectangular-like shape.

31. The detection device of claim 28, wherein the conductive line extends into the tab portion such that when the tab is pulled to a certain extent the conductive line is severed.

32. The detection device of claim 23, wherein the printed circuit comprises a flap partially cut out from the printed circuit in a G-like shape.

33. The detection device of claim 32, wherein the flap portion includes the member.

34. The detection device of claim 32, wherein the flap comprises a first portion attached to the printed circuit and a second portion detached from the printed circuit and attached to the first portion.

35. The detection device of claim 34, wherein the conductive line extends through the first portion of the flap into the second portion of the flap.

36. The detection device of claim 35, wherein when the second portion of the flap is pulled to a certain extent to tear off the second portion of the flap from the first portion of the flap, the conductive line is severed.

37. A method of detecting a change in operating state, comprising:
coupling electrically a pair of contacts to each other using a member in an original state;
severing a portion of the member from a remainder of the member to change the electrical coupling between the contacts, wherein the member is physically configured to prevent return to the original state; and
detecting the change in the coupling between the pair of contacts.

38. The method of claim 37, wherein the coupling includes conductively coupling the pair of contacts using the member.

39. The method of claim 37, wherein the coupling includes capacitively coupling the pair of contacts using the member.

40. The method of claim 37, further comprising selectively operating a battery management function in response to the detecting of the change in the coupling.

41. The method of claim 40, wherein the battery management function comprises a battery discharge operation.

42. The method of claim 40, wherein the battery management function comprises a battery state of charge indication.

43. The method of claim 37, wherein the detecting of a change in the coupling comprises:
maintaining a first state prior to moving the member, and
enabling a change from the first state to a second state in response to the change in the coupling.

44. The method of claim 43, further comprising triggering the change to a second state with a current.

45. The method of claim 43, further comprising triggering the change to a second state with an electrical current pulse.

46. The method of claim 43, further comprising triggering the change to a second state with a battery management circuit.

47. The method of claim 46, wherein the battery management circuit comprises a battery state-of-charge indicator.

48. The method of claim 37, wherein the detecting of the change in the coupling comprises measuring a change in an RC time constant associated with the coupling.

49. The method of claim 48, wherein the measuring comprises using an electrical pulse.

50. The method of claim 48, further comprising triggering the measuring with a battery management circuit.

51. The method of claim 50, wherein the battery management circuit comprises a battery state-of-charge indicator.

52. The method of claim 37, wherein the coupling of the pair of contacts comprises coupling with a conductive line.

53. The method of claim 37, wherein the coupling of the pair of contacts comprises coupling the pair of contacts via an electronic component disposed in the member.

54. The method of claim 53, wherein the coupling of the pair of contacts comprises conductively coupling, resistively coupling, capacitively coupling, inductively coupling, or semi-conductively coupling, or a combination thereof, of the pair of contacts.

55. A method of detecting a change in operating state, comprising:
coupling electrically a pair of contacts to each other using a member in an original state, the member comprising a printed circuit having a portion adapted to be only once movable to change the electrical coupling between the contacts;
changing the coupling between the pair of contacts by pulling a tab portion of the member, wherein the pulling includes severing a conductive line on the printed circuit and extending into the tab portion, wherein the member is physically configured to prevent return to the original state; and
detecting the change in the coupling between the pair of contacts when the conductive line is severed.

56. A method of detecting a change in operating state, comprising:
coupling electrically a pair of contacts to each other using a member in an original state, the member adapted to be only once movable to change the electrical coupling between the contacts;
changing the coupling between the pair of contacts by pulling a flap attached in a printed circuit including the pair of contacts, wherein pulling the flap comprises tearing off a first portion of the flap detached from the printed circuit from a second portion of the flap attached to the printed circuit to sever a conductive line extending from the first portion of the flap into the second portion of the flap and wherein the member is physically configured to prevent return to the original state; and
detecting the change in the coupling between the pair of contacts when the conductive line is severed.

* * * * *